US008771029B2

(12) United States Patent
Zukauskas et al.

(10) Patent No.: US 8,771,029 B2
(45) Date of Patent: Jul. 8, 2014

(54) MULTIWAVELENGTH SOLID-STATE LAMPS WITH AN ENHANCED NUMBER OF RENDERED COLORS

(71) Applicant: Sensor Electronic Technology, Inc., Columbia, SC (US)

(72) Inventors: Arturas Zukauskas, Vilnius (LT); Rimantas Vaicekauskas, Vilnius (LT); Feliksas Ivanaukas, Vilnius (LT); Henrikas Vaitkevicius, Vilnius (LT); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 13/887,982

(22) Filed: May 6, 2013

(65) Prior Publication Data

US 2013/0241436 A1 Sep. 19, 2013

Related U.S. Application Data

(63) Continuation of application No. 12/368,546, filed on Feb. 10, 2009, now Pat. No. 8,436,526.

(60) Provisional application No. 61/065,349, filed on Feb. 11, 2008.

(51) Int. Cl.
*H01L 33/00* (2010.01)

(52) U.S. Cl.
USPC .................................................. 445/3; 445/24

(58) Field of Classification Search
USPC ........... 313/498–512, 483–487; 445/3, 24, 25
See application file for complete search history.

(56) References Cited

U.S. PATENT DOCUMENTS

| | | | |
|---|---|---|---|
| 4,176,294 | A | 11/1979 | Thornton, Jr. |
| 5,851,063 | A | 12/1998 | Doughty et al. |
| 6,234,645 | B1 | 5/2001 | Borner et al. |
| 6,817,735 | B2 | 11/2004 | Shimizu et al. |
| 6,890,085 | B2 | 5/2005 | Hacker |
| 7,008,078 | B2 | 3/2006 | Shimizu et al. |

(Continued)

FOREIGN PATENT DOCUMENTS

JP 2007059898 A 3/2007

OTHER PUBLICATIONS

Wyszecki et al, Color Science, "Concepts and Methods, Quantitative Data and Formulae", Second Edition, Wiley Classics Library Edition Published 2000, pp. 566-570.

(Continued)

*Primary Examiner* — Mariceli Santiago
(74) *Attorney, Agent, or Firm* — LaBatt, LLC

(57) ABSTRACT

The configuration of polychromatic sources of white light, which are composed of at least two groups of colored emitters, such as light-emitting diodes (LEDs), is disclosed. Based on a novel approach of the assessment of quality of white light using, for example, 1269 test color samples from the enhanced Munsell palette, the spectral compositions of light, such as white light, composed of two to five (or more) narrow-band emissions with the highest number of colors relevant to human vision rendered almost indistinguishably from a reference source, such as a blackbody radiator, are introduced. An embodiment of the current invention can be used, in particular, for configuring polychromatic sources of white light with the ultimate quality capable of rendering of all colors of the real world.

20 Claims, 12 Drawing Sheets

(56) References Cited

U.S. PATENT DOCUMENTS

| | | | | |
|---|---|---|---|---|
| 7,332,106 | B2 | 2/2008 | Yoshino et al. | |
| 7,597,821 | B2 | 10/2009 | Sakuma et al. | |
| 8,436,526 | B2 * | 5/2013 | Zukauskas et al. | 313/501 |
| 2002/0180345 | A1 | 12/2002 | Hen | |
| 2004/0070736 | A1 | 4/2004 | Roddy et al. | |
| 2005/0127833 | A1 | 6/2005 | Tieszen | |
| 2006/0104058 | A1 | 5/2006 | Chemel et al. | |
| 2006/0152140 | A1 | 7/2006 | Brandes | |
| 2006/0186377 | A1 | 8/2006 | Takahashi et al. | |
| 2006/0214175 | A1 | 9/2006 | Tian | |
| 2008/0007172 | A1 | 1/2008 | Tan et al. | |
| 2008/0258110 | A1 | 10/2008 | Oshio | |
| 2009/0231832 | A1 | 9/2009 | Zukauskas et al. | |

OTHER PUBLICATIONS

Wierer et al., "High-power AlGaInN flip-chip light-emitting diodes", Applied Physics Letters, vol. 78, No. 22, pp. 3379-3381, © 2001 American Institute of Physics.
Krames et al., "High-power truncated-inverted-pyramid light emitting . . . ", Applied Physics Letters, vol. 75, No. 16, pp. 2365-2367, © 1999 American Institute of Physics.
Zukauskas et al., "Optimization of white polychromatic semiconductor lamps", Applied Physics Letter, vol. 80, No. 2, pp. 234-236, © 2002 American Institute of Physics.
Jeff Y. Tsao, "Solid-State Lighting" pp. 28-37, IEEE Circuits & Devices Magazine, May/Jun. 2004.
Steigerwald et al., "Illumination with Solid State Lighting Technology", pp. 310-320, IEEE Journal on Selected Topics in Quantum Electronics, vol. 8, No. 2, Mar./Apr. 2002.
Krames et al., "Status and Future of High-Power Light-Emitting Diodes for Solid-State Lighting", pp. 160-175, Journal of Display Technology, vol. 3, No. 2, Jun. 2007.
David L. MacAdam, "Journal of the Optical Society of America", vol. 32, No. 5, pp. 247-274, May 1942.
Vitta et al., "White Complementary Solid-State Lamp", pp. 59-66, Leukos, vol. 1, No. 1, Jul. 2004.
Sandor et al., "Visual colour rendering based on colour difference evaluations", Lighting Research Technology, vol. 38, No. 3, pp. 225-239, 2006.
Shur et al., "Solid-State Lighting: Toward Superior Illumination", pp. 1691-1703, Proceedings of the IEEE, vol. 93, No. 10, Oct. 2005.
Dousmanis et al., "Evidence of Refrigerating Action by Means of Photon Emission in Semiconductor Diodes", pp. A316-A318, Physical Review, vol. 133, No. 1A, Jan. 6, 1964.
Narendran et al., "Color Rendering Properties of LED Light Sources", pp. 61-67, Proceedings of SPIE, vol. 4776 © 2002.
Schubert et al., "Solid-State Light Sources Getting Smart", pp. 1273-1278, Science, vol. 308, May 27, 2005, www.sciencemag.org.
Zukauskas et al., "Solid State Lighting", pp. 1-132, Copyright © Wiley (2002), http://nina.ecse.rpi.edu/shur/.
CIE, Publication No. 13.3, 1995.
Shuji Nakamura et al., "The Blue Laser Diode, GaN Based Light Emitters and Lasers", Springer, Berlin, 1999.
E. Fred Schubert, "Light-Emitting Diodes", Cambridge, University, Cambridge, New York, 2006.
E. Fred Schubert et al., "Solid-State Lighting—a Benevolent Technology", Reports on Progress in Physics 69, pp. 3069-3099, 2006.
Dorothy Nickerson, "Optical Society of America (OSA) Uniform Color Scale Samples", JSTOR: Leonardo, vol. 12, No. 3, pp. 206-212, 1979.
Roy S. Berns et al., "Development of the 1929 Munsell Book of Color: A Historical Review", Color Research Application 10, pp. 246-250, 1985.
Lee Young Bae, PCT, "Notification of Transmittal of the International Search Report and Written Opinion of the International Searching Authority, or the Declaration", Date of Mailing, Sep. 1, 2009, International Application No. PCT/US2009/033730.
Narukawa et al., "Recent Progress of High Efficiency White LEDs", Phys. Stat. Sol. (a) 204, No. 6, pp. 2087-2093, 2007.
Kimura et al., "Extrahigh Color Rendering White Light-Emitting Diode Lamps Using Oxynitride and Nitride Phosphors Excited by Blue Light-Emitting Diode", Applied Physics Letters 90, 2007.
Chih-Chieh Yang et al., "Highly Stable Three-Band White Light from an InGaN-based Blue Light-Emitting Diode Chip Precoated with (oxy)nitride Green/Red Phosphors", Applied Physics Letters 90, 123503, 2007.
P. Schlotter et al., "Rapid Communication, Luminescence Conversion of Blue Light Emitting Diodes", Applied Physics, A 64, pp. 417-418, 1997.
Regina Mueller-Mach et al., "High-Power Phosphor-Converted Light-Emitting Diodes Based on III-Nitrides", IEEE Journal on Selected Topics in Quantum Electronics, vol. 8, No. 2, pp. 339-345, Mar./Apr. 2002.
Kaufmann et al., "Ultraviolet Pumped Tricolor Phosphor Blend White Emitting LED's", Phys. Stat. Sol. (a) 188, No. 1, pp. 143-146, 2001.
Shibata et al, "Fabrication of LED Based on III-V Nitride and its Applications", Phys. Stat. Sol. (a) 200, No. 1, pp. 58-61, 2003.
Regina Mueller-Mach, "Highly Efficient All-Nitride Phosphor-Converted White Light Emitting Diode", Phys. Stat. Sol. (a) 202, No. 9, pp. 1727-1732, 2005.
Shionoya et al., "Phosphor Handbook", CRC Press, 1999.
Dorothy Nickerson et al., "Munsell Renotations for Samples of OSA Uniform Color Scales", Journal of Optical Society of America, vol. 68, No. 10, pp. 1343-1347, Oct. 1978.
Zukauskas et al., "Rendering a color palette by light-emitting diodes", Applied Physics Letter 93, © 2008 American Institute of Physics.
PCT, "Notification of Transmittal of the International Search Report and Written Opinion of the International Searching Authority, or the Declaration", Date of Mailing, Oct. 16, 2009, International Application No. PCT/US2009/036761.
PCT, "Notification of Transmittal of the International Search Report and Written Opinion of the International Searching Authority, or the Declaration", Date of Mailing, Oct. 16, 2009, International Application No. PCT/US2009/036763.
Yolaine Cussac, PCT, "Notification Concerning Transmittal of International Preliminary Report on Patentability", Date of Mailing Aug. 26, 2010, International Application No. PCT/US2009/033730.
Simin Baharlou, PCT, "Notification Concerning Transmittal of International Preliminary Report on Patentability", Date of Mailing Sep. 30, 2010, International Application No. PCT/US2009/036761.
Simin Baharlou, PCT, "Notification Concerning Transmittal of International Preliminary Report on Patentability", Date of Mailing Sep. 30, 2010, International Application No. PCT/US2009/036763.
Karabi Guharay, USPTO Notice of Allowance and Fee(s) Due, U.S. Appl. No. 12/401,057, Date Mailed Apr. 4, 2011, 17 pages.
Thomas A. Hollweg, USPTO Office Action, U.S. Appl. No. 12/401,043, Notification Date Aug. 24, 2011, 21 pages.
Thomas A. Hollweg, USPTO Final Office Action, U.S. Appl. No. 12/401,043, Notification Date Dec. 19, 2011, 18 pages.
Thomas A. Hollweg, USPTO Office Action, U.S. Appl. No. 12/401,043, Notification Date Mar. 30, 2012, 8 pages.
Mariceli Santiago, USPTO Office Action, U.S. Appl. No. 12/368,546, Notification Date Apr. 4, 2011, 15 pages.
Mariceli Santiago, USPTO Office Action, U.S. Appl. No. 12/368,546, Notification Date Nov. 14, 2011, 17 pages.
Color Usage Research Lab, Luminance and Chromaticity, http://colorusage.arc.nasa.gov/lum_and_chrom.php, [Retrieved Nov. 3, 2011], 5 pages.
Color World, Now, Color System, Dainichiseika Color & Chemicals Mfg. Co., Ltd., http://www.daicolor.co.jp/english/color_e/color_e01.html, [Retrieved Nov. 3, 2011], 12 pages.
Thomas A. Hollweg, USPTO Examiner's Answer, U.S. Appl. No. 12/401,043, Notification Date May 24, 2013, 24 pages.
Thomas A. Hollweg, USPTO Final Office Action, U.S. Appl. No. 12/401,043, Notification Date Oct. 11, 2012, 12 pages.
Santiago, U.S. Appl. No. 12/368,546, Office Action Correspondence, Jun. 26, 2012, 13 pages.

* cited by examiner

MULTIWAVELENGTH SOLID-STATE LAMPS WITH AN ENHANCED NUMBER OF RENDERED COLORS

REFERENCE TO PRIOR APPLICATIONS

The current application is a continuation of U.S. patent application Ser. No. 12/368,546, titled "Multiwavelength Solid-State Lamps with an Enhanced Number of Rendered Colors," which was filed on 10 Feb. 2009 and will issue on 7 May 2013 as U.S. Pat. No. 8,436,526, and which claims the benefit of co-pending U.S. Provisional Application No. 61/065,349, titled "Multiwavelength Solid-State Lamp with an Enhanced Number of Rendered Colors," which was filed on 11 Feb. 2008, both of which are hereby incorporated by reference.

TECHNICAL FIELD

Aspects of the present invention relate to the quality of white light generated by polychromatic sources of white light, which are composed of at least two groups of colored emitters, such as light-emitting diodes (LEDs) or lasers, having different emission peak wavelengths. In particular, an embodiment of the present invention describes a new approach for the assessment and optimization of white light source quality using a large number of test color samples, and discloses the spectral compositions of white light composed of narrow-band emissions with the highest number of colors relevant to human vision rendered almost indistinguishably from a blackbody radiator or daylight-phase illuminant.

BACKGROUND ART

Composing white light from colored components in an optimum way has been a key problem of the lighting industry since the introduction of fluorescence lamps in the 1930s. Presently, the ability of white light to properly render the colors of illuminated objects is optimized by maximizing the general color rendering index, $R_a$, a figure of merit introduced by the International Commission of Illumination (Commission Internationale d'Éclairage, CIE) in 1974 and updated in 1995 (CIE Publication No. 13.3, 1995). A trichromatic system with a maximized $R_a$ composed of red (610 nm), green (540 nm) and blue (450 nm) components (W. A. Thornton, U.S. Pat. No. 4,176,294, 1979) is widely accepted in lighting technology as a white light standard.

The development of efficient LEDs radiating in the short-wavelength range of the visible spectrum has resulted in the emergence of solid-state lighting. Since LEDs employ injection electroluminescence and potentially offer radiant efficiency that exceeds the physical limits of other sources of light, solid-state lighting is a tremendous lighting technology with the promise of the highest electric power conservation and vast environmental benefits.

Composite white light from LEDs can be obtained by means of partial or complete conversion of short-wavelength radiation in phosphors, using a set of primary LED chips with narrow-band emission spectrums or a complementary use of both phosphor-conversion and colored LEDs. The multichip approach based on colored LEDs offers an unsurpassed versatility in color control, since the peak wavelengths of the LEDs can be tailored by varying the chemical contents and thickness of the active layers.

Using a large number of colored LEDs with different wavelengths allows for tailoring continuous illumination spectra similar to those of blackbody radiators or sunlight, which are widely accepted as the ultimate-quality sources of white light. This requires the determination of the LED wavelengths providing the best possible quality of light for a given number of colored LEDs comprising a white light source, the number of colors that can be rendered by a white light source composed of a particular number of colored LEDs, and the minimal number of LEDs required for attaining the ultimate quality of white light. However, the existing approach of designing composite white light sources relies on the CIE 1995 procedure (CIE Publication No. 13.3, 1995), which employs the general color rendering index $R_a$ based on eight test color samples and an additional six special color rendering indexes. This number of colors (eight to fourteen) is much smaller than that resolved by human vision.

SUMMARY OF THE INVENTION

The inventors recognize that the above-described techniques, used in most white light sources composed of colored LEDs, suffer from a number of disadvantages including, for example:

(a) The quality of the light produced by different white light sources is not compared in terms of more than fourteen different rendered colors;

(b) The number of different rendered colors above fourteen is not maximized when designing a white light source;

(c) The necessary and sufficient number of spectral components to produce the white light, which allows color rendering for a given number of different color samples that exceeds fourteen, is not determined; and (d) The wavelengths and relative fluxes of the colored light emitters comprising the white light source that renders more than fourteen colors and has the maximum output light quality among all the like sources is not determined.

Aspects of the present invention relate to the quality of white light generated by polychromatic sources of white light, which are composed of at least two groups of colored emitters, such as light-emitting diodes (LEDs) or lasers, having different emission peak wavelengths. In particular, an embodiment of the present invention describes a new approach for the assessment and optimization of white light source quality using a large number of test color samples, and discloses the spectral compositions of white light composed of narrow-band emissions with the highest number of colors relevant to human vision rendered almost indistinguishably from a blackbody radiator or daylight-phase illuminant.

A first aspect of the invention provides a light source comprising: at least two sets of visible-light emitters, each set of emitters having a primary color, wherein the at least two sets of visible-light emitters are configured using a plurality of test color samples including more than fourteen test color samples resolved by an average human eye as different and a reference light source dissimilar from the at least two sets of visible-light emitters, by performing a method comprising: selecting at least one of: the primary colors or relative fluxes generated by each set of emitters to maximize a number of the plurality of test color samples for which, when illuminated using the light source having a predetermined correlated color temperature instead of the reference light source having the predetermined correlated color temperature: chromaticity shifts resulting from use of the light source instead of the reference light source are preserved within corresponding regions of a chromaticity diagram, each region defined by a color at a center of the region and a predetermined chromaticity variation value from the color at the center of the region; and lightness shifts resulting from use of the light source instead of the reference light source are preserved within a predetermined lightness variation value.

Another aspect of the invention provides a lighting method, comprising: configuring at least two sets of visible-light emitters using a plurality of test color samples including more than fourteen test color samples resolved by an average human eye and a reference light source dissimilar from the at least two sets of visible-light emitters, each set of emitters having a primary color, wherein the configuring includes selecting at least one of: the primary colors or relative fluxes generated by each set of emitters to maximize a number of the plurality of test color samples for which, when illuminated using the light source having a predetermined correlated color temperature instead of the reference light source having the predetermined correlated color temperature: chromaticity shifts resulting from use of the light source instead of the reference light source are preserved within corresponding regions of a chromaticity diagram, each region defined by a color at a center of the region and a predetermined chromaticity variation value from the color at the center of the region; and lightness shifts resulting from use of the light source instead of the reference light source are preserved within a predetermined lightness variation value.

Another aspect of the invention provides a lighting method, comprising: generating white light using at least two sets of visible-light emitters, each set of emitters having a primary color, wherein the at least two sets of visible-light emitters are configured using a plurality of test color samples including more than fourteen test color samples resolved by an average human eye and a reference light source dissimilar from the at least two sets of visible-light emitters, wherein the at least two sets of visible-light emitters are configured by: selecting at least one of: the primary colors or relative fluxes generated by each set of emitters to maximize a number of the plurality of test color samples for which, when illuminated using the light source having a predetermined correlated color temperature instead of the reference light source having the predetermined correlated color temperature: chromaticity shifts resulting from use of the light source instead of the reference light source are preserved within corresponding regions of a chromaticity diagram, each region defined by a color at a center of the region and a predetermined chromaticity variation value from the color at the center of the region; and lightness shifts resulting from use of the light source instead of the reference light source are preserved within a predetermined lightness variation value.

Other aspects of the invention may include and/or implement some or all of the features described herein. The illustrative aspects of the invention are designed to solve one or more of the problems herein described and/or one or more other problems not discussed.

DETAILED DESCRIPTION OF THE INVENTION

Figure 1:
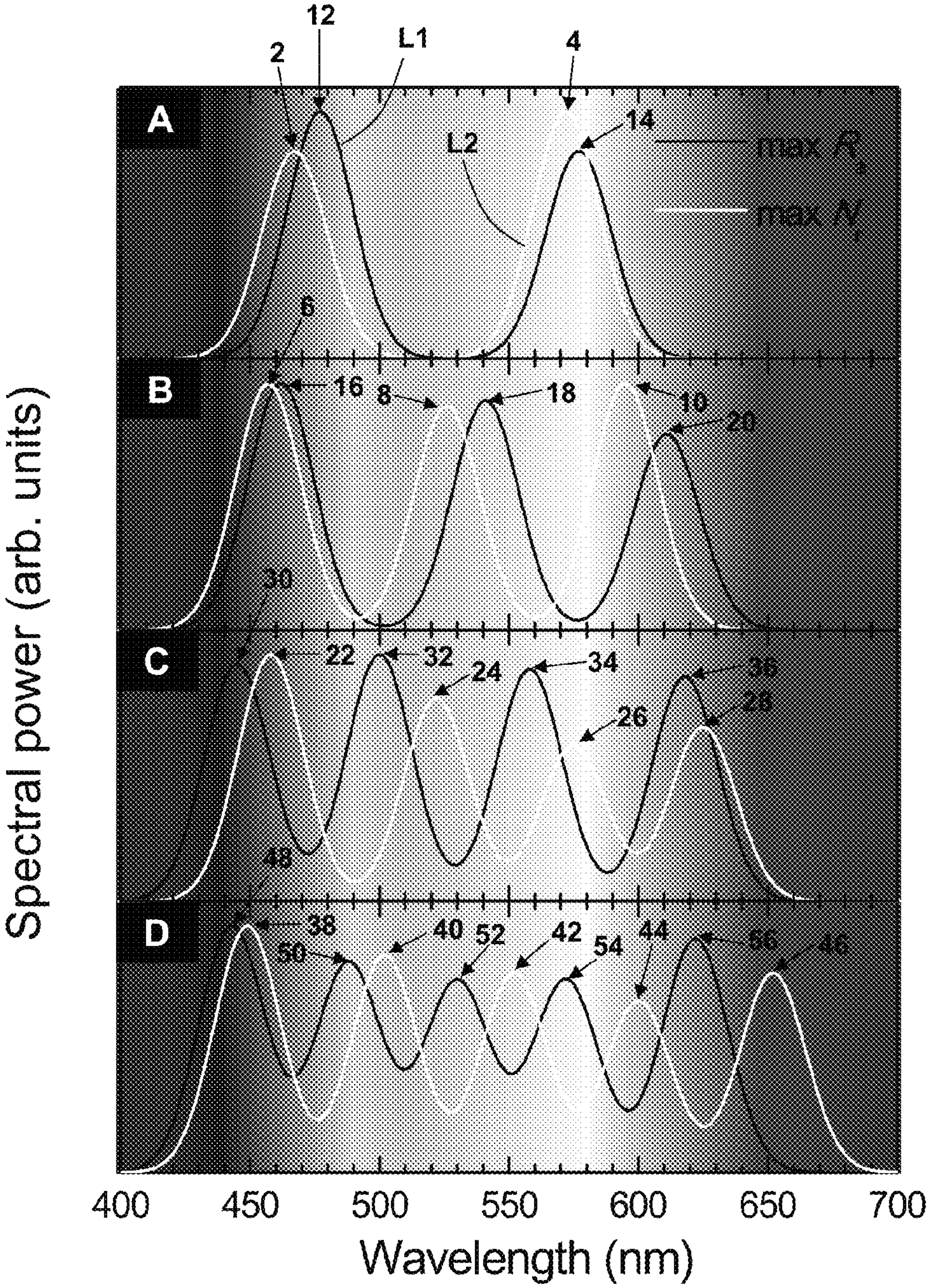
FIG. 1 depicts the obtained optimized spectral power distributions of multichip solid-state lamps for two (A), three (B), four (C) and five (D) primary LEDs (6500 K color temperature). As indicated in the legend, the dark lines represent sources with the maximized general color rendering index, while the lighter lines represent sources with the maximized number of rendered colors.

In accordance with an embodiment of the present invention, a lighting source having a predetermined correlated color temperature is provided. The lighting source comprises several sets of colored visible-light emitters, with the primary colors and relative fluxes generated by each set of emitters selected in such a way that in comparison with a reference lighting source, when each of pre-selected test color samples resolved by the average human eye as different is illuminated, preserve the sample color indistinguishable from an origin of a corresponding region of a chromaticity diagram by the average human eye. As used herein, unless otherwise noted, the term "set" means one or more (i.e., at least one) and the phrase "any solution" means any now known or later developed solution.

DEFINITIONS

LED—light emitting diode.

Color space—a model for mathematical representation of a set of colors.

Munsell samples—a set of color samples introduced by Munsell and then updated, such that each sample is characterized by the hue, value (lightness scale), and chroma (color purity scale).

MacAdams ellipses—the regions on the chromaticity plane of a color space that contain all colors which are indistinguishable, to the average human eye, from the color at the center of the region.

Standard illuminant—a standardized spectral power distribution of visible light, which allows colors recorded under different lighting to be compared.

An embodiment of the present invention provides a source of white light nearly identical to a blackbody radiator or daylight-phase illuminant in terms of its perception by the human eye. In order to characterize and compare different sources of white light, aspects of the invention introduce a characteristic of the light source related to rendering of colors of illuminated objects, which is used further in embodiments of this invention description to evaluate the white light source quality.

To characterize white light, embodiments of the present invention provide an advanced color rendering assessment procedure. A common approach for the assessment of the color-rendering properties of a light source is based on the estimation of color differences (e.g., shifts of the color coordinates in an appropriate color space) for test samples when the source under consideration is replaced by a reference source (e.g., blackbody or extrapolated daylight illuminant). The standard CIE 1995 procedure, which was initially developed for the rating of halophosphate fluorescent lamps with relatively wide spectral bands, and which was later refined and extended, employs only eight to fourteen test samples from the vast palette of colors originated by the artist A. H. Munsell in 1905. When applied to sources composed of narrow-band emitters, such as LEDs, the CIE 1995 procedure receives criticism that is mainly due to the small number of test samples (eight to fourteen) employed. Another drawback is the use of equally treated shifts for all samples in a color space, which lacks uniformity in terms of perceived color differences. In fact, the CIE 1960 Uniform Chromaticity Scale (UCS) space, which is employed in the standard color rendering assessment procedure, is completely symmetrized only around the very central point.

Aspects of the present invention are based on using a much larger number of test samples and on the color differences distinguished by human vision for each of these samples. To this end, an embodiment of the present invention employs the entire Munsell palette, which specifies the perceived colors in three dimensions: hue; chroma (saturation); and value (lightness). A spectrofotometrically calibrated set of 1269 Munsell samples is used, which (with some exceptions for highly saturated colors) can be referred to as all colors of the real world. The Joensuu Spectral Database, available from the University of Joensuu Color Group, is an example of a spectrophotometrically calibrated set of 1269 Munsell samples that can be used in the practice of an embodiment of the present invention.

The perceived color differences are evaluated using MacAdam ellipses, which are the experimentally determined regions in the chromaticity diagram (hue-saturation plane), containing colors that are indistinguishable by human vision. A nonlinear interpolation of the ellipses determined by MacAdam for 25 colors is employed to obtain the ellipses for the entire 1269-element Munsell palette. For instance, using the inverse distance weighted (geodesic) method, an ellipse centered at the chromaticity coordinates (x, y) has an interpolated parameter (a minor or major semiaxis or an inclination angle) given by the formula $$P(x, y) = \sum_{n=1}^{25} h_i^{-2} P_0(x_{0i}, y_{0i}) \Big/ \sum_{n=1}^{25} h_i^{-2},$$

where $P_0(x_{0i}, y_{0i})$ is a corresponding experimental parameter, and h, is the distance from the center of the interpolated ellipse to an original MacAdam ellipse $$h_i = \sqrt{(x-x_{0i})^2+(y-y_{0i})^2}.$$

A rendered chromaticity of a sample is defined as that which shifts only within the 3-step MacAdam ellipse (i.e., by less than three radii of the ellipse) with the chromatic adaptation taken into account (e.g., in the way used in CIE Publication No. 13.3, 1995). The allowed difference in lightness (the third coordinate) is set to 2% for all the samples. If the color point moves out of such an elliptical cylinder when switching from the reference illuminant to that under test, the distortion of the sample color will be noticed by over 99% of individuals with normal vision. As a figure of merit for the overall assessment of color rendering properties of a lamp, the present invention introduces a Number of Rendered Colors, $N_r$, measured in percents in respect of the total number of the test samples (1269), which is the proposed alternative to the general color rendering index $R_a$ based on eight test samples.

Aspects of the present invention perform optimization of white solid-state lamps with different number of primary colored LEDs n, using correlated color temperatures in the entire relevant range of 2500 K to 10000 K. In particular, the color temperature of 6500 K is of importance, since it almost fits the chromaticity of daylight. The spectra of dichromatic (n=2), trichromatic (n=3), tetrachromatic (n=4), and pentachromatic (n=5) lamps are composed of spectral lines of colored LEDs, which can be approximated by, e.g., Gaussian lines with a full width at half magnitude of the electroluminescence bands of 30 nm (which is an average value for common high-brightness AlInGaP and InGaN LEDs at typical operating junction temperatures). A method of optimization in the 2n-dimensional parametric space of peak wavelengths and relative powers is applied in order to maximize an objective function. The objective function maximized in the optimization process was either $N_r$ or $R_a$.

An example of a suitable method of optimization in the 2n-dimensional parametric space of peak wavelengths and relative powers is summarized below.

The optimization of the spectral power distribution (SPD), S(λ), for white emitters based on additive color mixing relies on the maximizing of an objective function, F, which is an appropriate figure of merit, e.g., the general color rendering index, $R_a$, or the Number of Rendered Colors, $N_r$. Consider an SPD that contains n emission lines from n sets of colored primary LEDs. For simplicity, Gaussian lines with peak wavelengths (j=1, . . . , n) are employed with the uniform width at half magnitude of 30 nm (an average value for AlInGaP and AlInGaN high-brightness LEDs for typical operating junction temperatures). The objective function depends on n peak wavelengths, $\lambda_j$, and n partial fluxes of the primary sets of LEDs, $I_j$. These 2n parameters (peak wavelengths and partial fluxes) require adjustment to obtain the white light of a predetermined chromaticity with the highest value of the objective function. Subjecting the 2n-dimensional space of parameters to common 3 color mixing equations results in that the solutions of the problem reside on a 2n-3-dimensional surface of the parameter space. A computer routine, which performs searching on the 2n-3-dimensional surface, can be used for finding the maximal value of the objective function. For large numbers of the primary sets, heuristic approaches that increase the operating speed of the searching routine can be applied.

Table 1 summarizes the color rendering properties of the optimized composite white light produced in accordance with aspects of the present invention. The striking result is that the pentachromatic lamp with the maximized $N_r$ renders 100% colors of the enhanced Munsell palette. As expected, all lamps with the maximized $N_r$ have lower $R_a$ than the corresponding counterparts optimized for the highest general color rendering index. In particular, the pentachromatic lamp with $N_r$=100% is rated by the standard CIE 1995 procedure only by $R_a$=98. This fact demonstrates shortcomings of the standard procedure of color rendering assessment for the highest-quality sources of white light. Attaining the highest values of $R_a$ can result in meaningless minimizing of already undistinguishable chromaticity shifts for eight standard samples.

Moreover, the represented maximized color rendering indices of the eight samples can result in lower rendering of some of the remaining 1261 colors of the Munsell palette.

TABLE 1

The general color rendering index $R_a$ and the number of rendered colors $N_r$ for polychromatic LED-based lamps.

| Type of lamp | Maximized figure of merit | General color rendering index | Number of rendered colors (%) |
|---|---|---|---|
| Dichromatic | $R_a$ | 22 | 3 |
| | $N_r$ | 16 | 4 |
| Trichromatic | $R_a$ | 89 | 46 |
| | $N_r$ | 82 | 60 |
| Tetrachromatic | $R_a$ | 98 | 86 |
| | $N_r$ | 96 | 92 |
| Pentachromatic | $R_a$ | 99 | 97 |
| | $N_r$ | 98 | 100 |

The technological feasibility of a pentachromatic lamp with $N_r$=100% is higher than that of the lamp with the maximized $R_a$. High-power efficient InGaN LEDs with the peak wavelengths at about 450 nm (deep blue) and 500 nm (cyan) are already available, as are AlGaInP LEDs with the peak wavelengths of 650 nm (deep red) and 600 nm (orange). The fifth primary LED emitting at 550 nm is somewhat easier to implement using InGaN technology than that emitting at 570 nm, with the latter wavelength required for the maximum $R_a$ falling exactly into the technological gap between InGaN and AlGaInP materials-based LEDs.

The results of aspects of the present invention show that conventional composite sources of white light, such as fluorescent and high-intensity discharge lamps with values of $R_a$ below 80 points, render less than half of colors of the Munsell palette. This is the probable reason why customers dislike such sources, especially for residential lighting. Similar drawbacks can be present in polychromatic solid-state lamps that are optimized using a standard approach in assessment of quality of white light using eight test samples.

FIG. 1 depicts the obtained optimized spectral power distributions of multichip solid-state lamps for two (A), three (B), four (C) and five (D) primary LEDs (6500 K color temperature). The lines L1 display spectra with the maximized $R_a$, whereas the lines L2 show the spectra with the maximized $N_r$. As seen, the spectra optimized for different objective functions differ in peak wavelengths of the spectral components. For example, as depicted in sections A and B of FIG. 1, the dichromatic spectrum (spectral components 2, 4; LEDs peaking at around 467 and 572 nm, respectively) and trichromatic spectrum (spectral components 6, 8, 10; LEDs peaking at around 457, 526, 595 nm, respectively) with the highest $N_r$ are shifted to shorter wavelengths in comparison with the counterpart dichromatic spectrum (spectral components 12, 14; LEDs peaking at around 477 and 577 nm, respectively) and trichromatic spectrum (spectral components 16, 18, 20; LEDs peaking at around 462, 541, 611 nm, respectively) optimized for the highest $R_a$.

As depicted in section C of FIG. 1, optimization of $N_r$ for the tetrachromatic spectrum (spectral components 22, 24, 26, 28; LEDs peaking at around 458, 522, 575, and 625 nm, respectively) with the highest $N_r$ are shifted to longer wavelengths in comparison with the counterpart tetrachromatic spectrum (spectral components 30, 32, 34, 36; LEDs peaking at around 445, 500, 558, and 618 nm, respectively) optimized for the highest $R_a$. Similarly, as depicted in section D of FIG. 1, optimization of $N_r$ for the pentachromatic spectrum (spectral components 38, 40, 42, 44, 46; LEDs peaking at around 449, 502, 552, 600, and 652 nm, respectively) with the highest $N_r$ are shifted to longer wavelengths in comparison with the counterpart pentachromatic spectrum (spectral components 48, 50, 52, 54, 56; LEDs peaking at around 443, 488, 530, 572, and 622 nm, respectively) optimized for the highest $R_a$.

Figure 2:
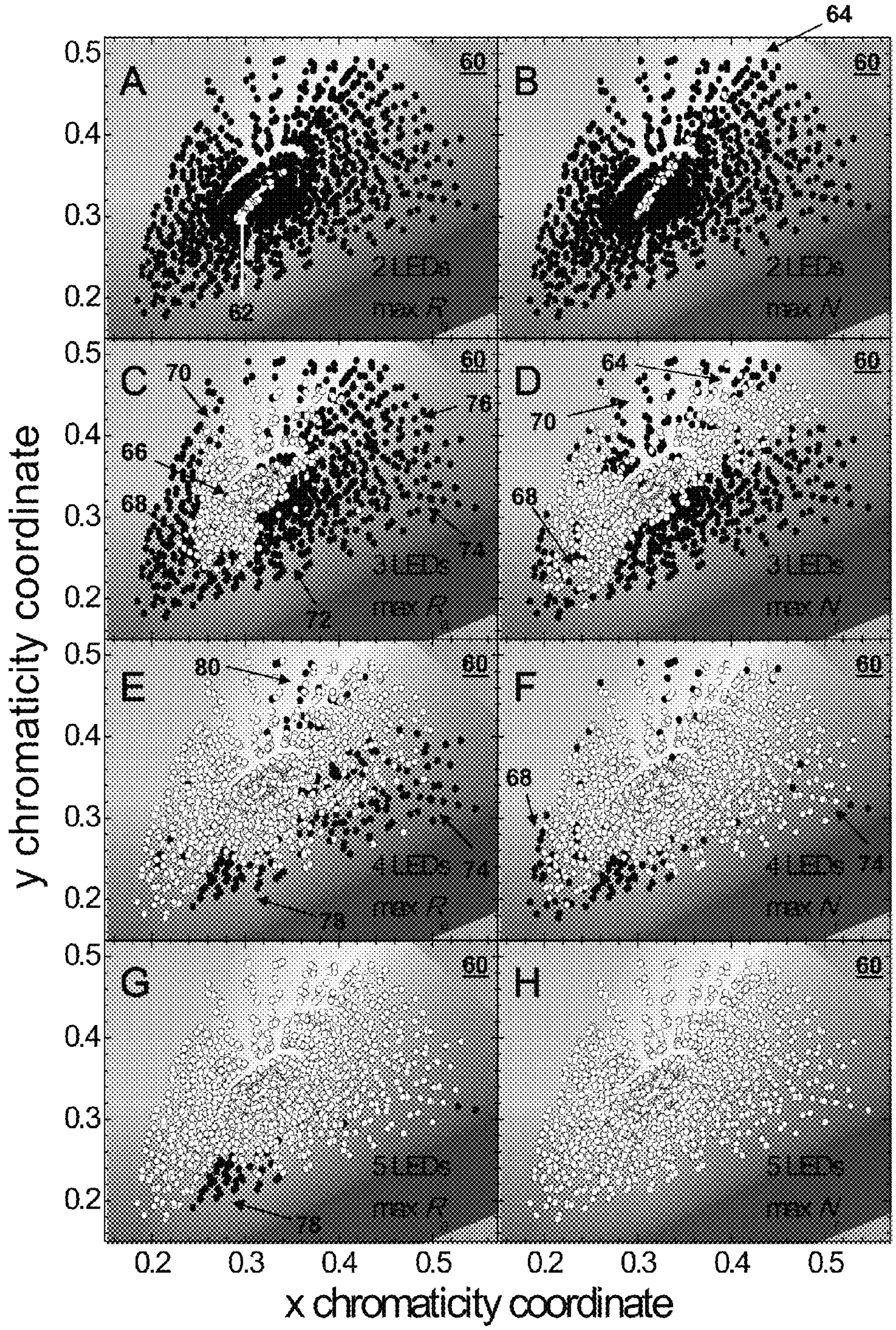
FIG. 2 shows the positions of the 1269 Munsell samples in the CIE 1931 chromaticity plane under illumination by the optimized dichromatic (A and B), trichromatic (C and D), tetrachromatic (E and F) and pentachromatic (G and H) LED-based sources of white light (6500 K color temperature). Open and filled points denote rendered and distorted colors, respectively. Parts A, C, E, and G represent sources with the maximized general color rendering index. Parts B, D, F, and H represent sources with the maximized number of rendered colors.

FIG. 2 shows the positions of the 1269 Munsell samples in the CIE 1931 chromaticity plane 60 under illumination by dichromatic (A and B), trichromatic (C and D), tetrachromatic (E and F) and pentachromatic (G and H) LED-based sources (e.g., lamps) of white light. Sources (A), (C), (E), (G) with the maximized general color rendering index $R_a$ (standard approach) were used on the left side of FIG. 2, while sources (B), (D), (F), (H) with the maximized number of rendered colors $N_r$, as provided in accordance with aspects of the present invention, were used on the right side of FIG. 2.

In FIG. 2, the filled points denote samples with the colors perceived as noticeably distorted and the open points denote rendered colors. Dichromatic sources (A), (B) are seen to distort the majority of colors except some blue-whitish 62 ones near the center. The $N_r$-maximized dichromatic source (B) renders a few additional colors in the yellow 64 direction, when compared to the $R_a$-maximized dichromatic source (A). The $R_a$-maximized trichromatic source (C) renders most low-saturation colors 66 (close to the center) and a considerable portion of bluish 68 and 70 greenish colors, whereas a vast area embracing red-purple 72, red 74, and orange 76 colors suffers from low rendering. Optimization based on $N_r$ results in a trichromatic source (D) with improved color rendering in the bluish 68 and especially yellow regions 64 at some expense of greenish 70 colors. The tetrachromatic source (E) with the maximized $R_a$ lacks rendering mainly in the red 74 and purple 78 regions and distorts some colors in the yellow-green 80 area. The optimization of the tetrachromatic source (F) based on $N_r$ results in a considerably improved color rendering in the red 74 region at some expense of saturated bluish 68 colors. The deep purple 78 colors still suffer from low rendering in the pentachromatic source (G) optimized basing on the $R_a$. This drawback completely disappears in the $N_r$-optimized pentachromatic source (H) of white light. This analysis shows that optimization based on $N_r$ becomes more important for the lamps with a higher quality of light.

Figure 3:
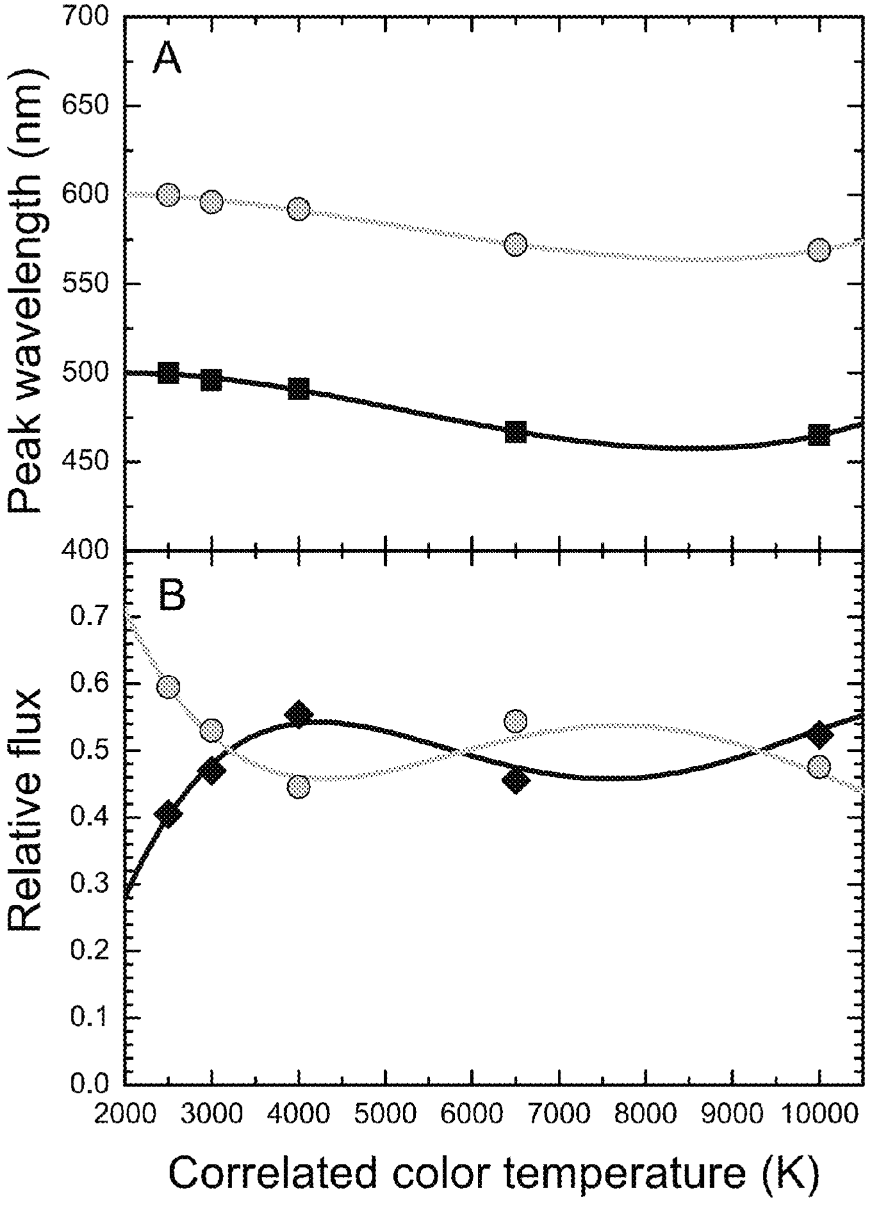
FIGS. 3 to 6 show the peak positions (parts A) and relative fluxes (parts B) as functions of correlated color temperature for LED-based polychromatic sources of white light, which have maximized numbers of rendered test color samples, for 2, 3, 4, and 5 primary LEDs, respectively.

FIG. 3 shows the peak positions (part A) and relative fluxes (part B) as functions of correlated color temperature for LED-based polychromatic sources of white light, which have maximized numbers of rendered test color samples $N_r$, for 2 sets of colored LEDs. Connecting lines in FIG. 3 (as well as in FIGS. 4-6) are guides to the eye.

Figure 4:
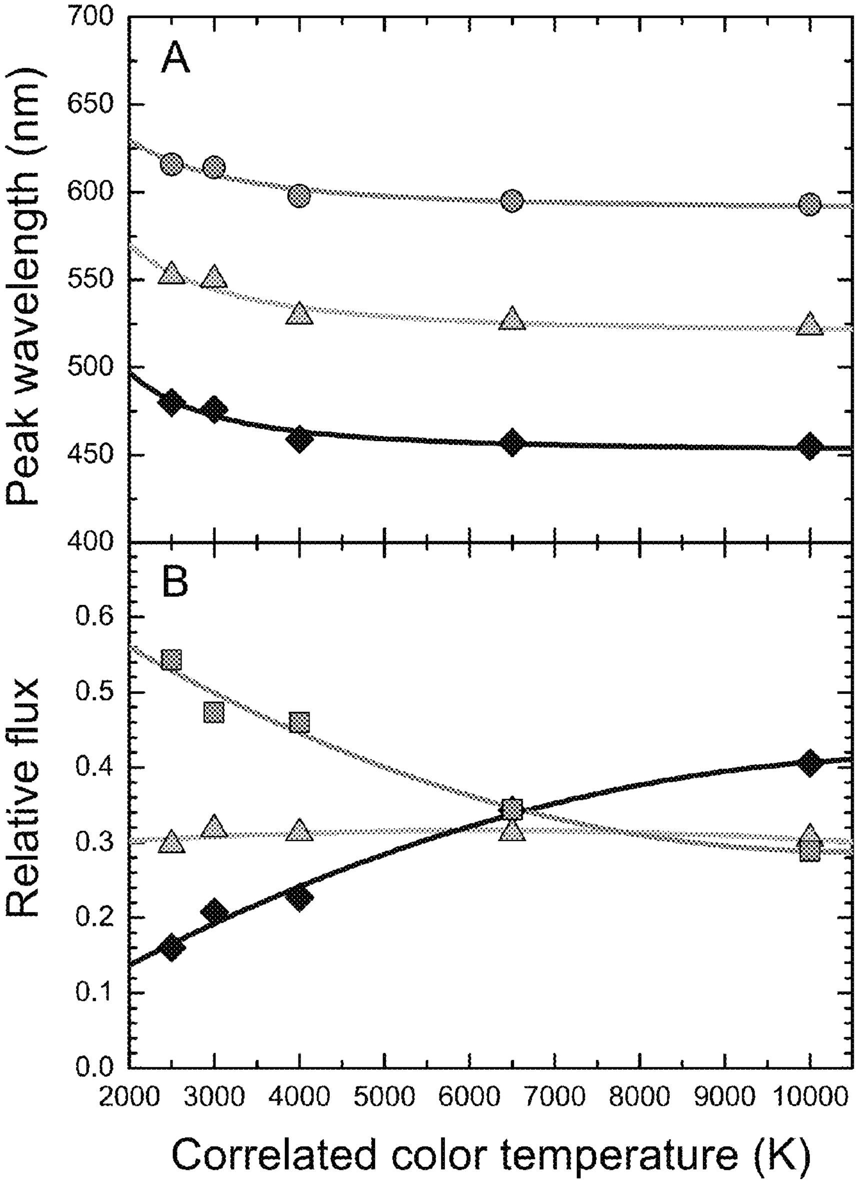

FIG. 4 shows the peak positions (part A) and relative fluxes (part B) as functions of correlated color temperature for LED-based polychromatic sources of white light, which have maximized numbers of rendered test color samples $N_r$, for 3 sets of colored LEDs.

Figure 5:
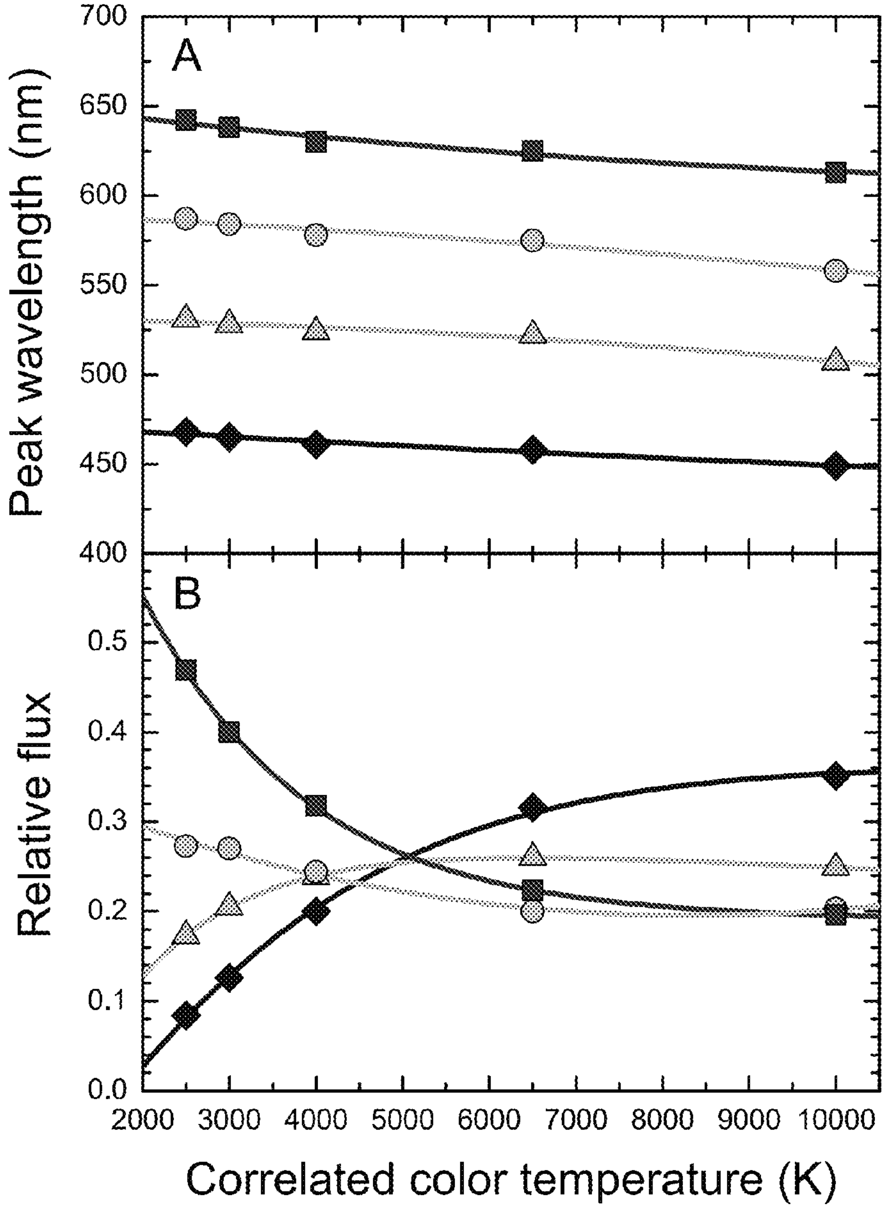

FIG. 5 shows the peak positions (part A) and relative fluxes (part B) as functions of correlated color temperature for LED-based polychromatic sources of white light, which have maximized numbers of rendered test color samples $N_r$, for 4 sets of colored LEDs.

Figure 6:
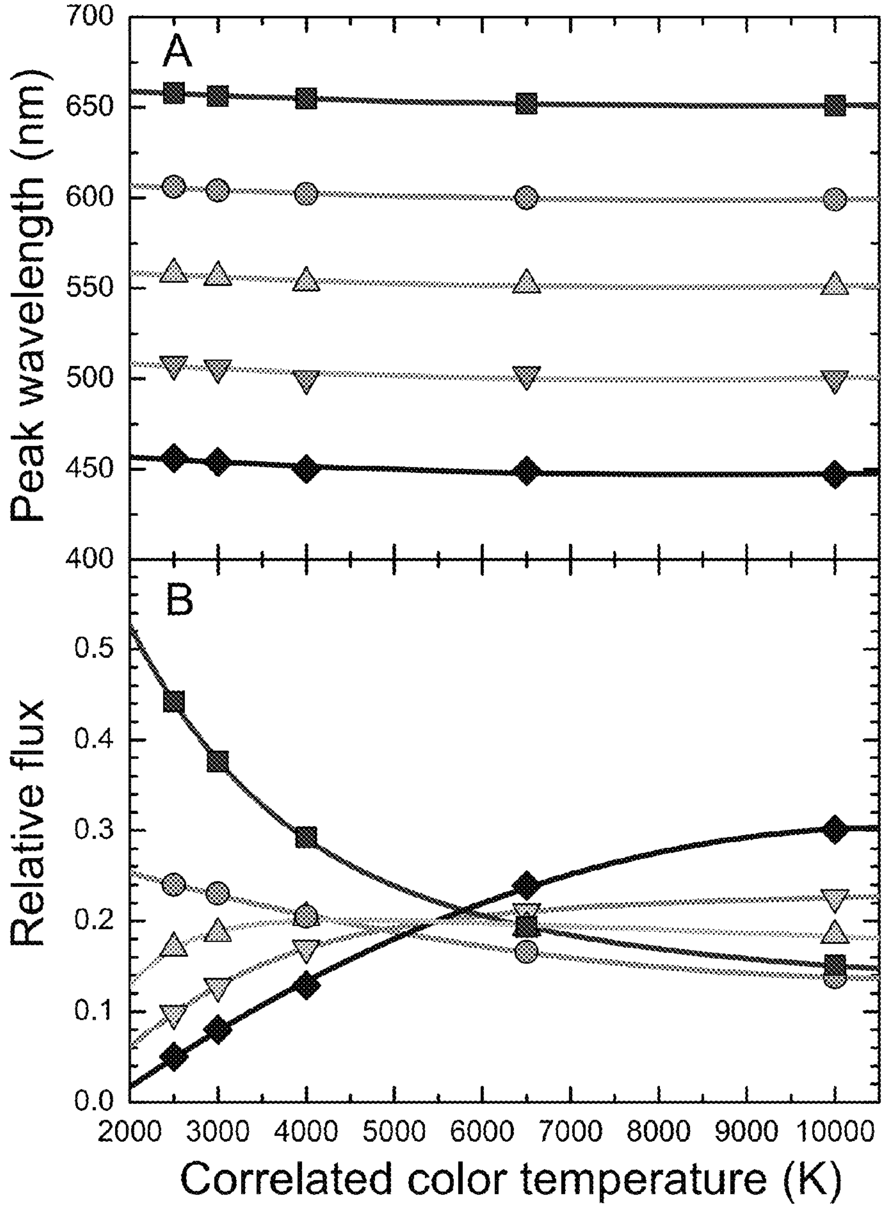

FIG. 6 shows the peak positions (part A) and relative fluxes (part B) as functions of correlated color temperature for LED-based polychromatic sources of white light, which have maximized numbers of rendered test color samples, for 5 sets of colored LEDs. Interestingly enough, the variation in the wavelength needed to obtain different correlated color temperatures in case of 5 sets is minimal, so that high quality white light sources can be easily tuned to the needed color temperature, for example, to simulate the illumination conditions in space, using the same sets of light emitters and only varying the flux ratios.

Figure 7:
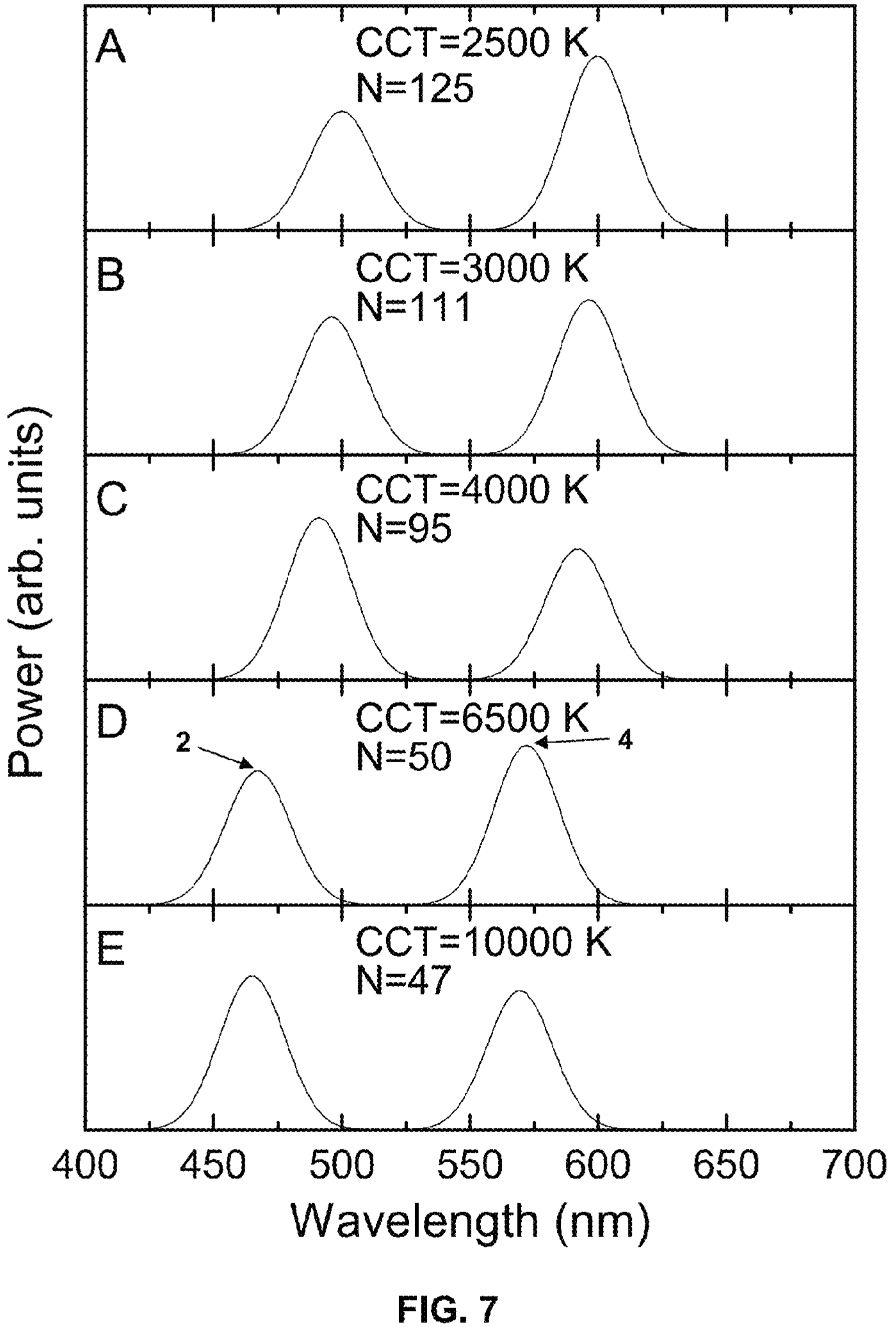
FIGS. 7 to 10 show the spectral power distributions for LED-based polychromatic sources of white light, which have maximized numbers of rendered test color samples (indicated), for 2, 3, 4, and 5 primary LEDs, respectively, for the correlated color temperature of 2500 K (parts A), 3000 K (parts (B), 4000 K (parts C), 6500 K (parts D), and 10000 K (parts E), respectively.

FIG. 7 shows the spectral power distribution for LED-based polychromatic source of white light utilizing 2 sets of colored LEDs, for the highest possible number of rendered test color samples (indicated). The spectra are simulated for the correlated color temperatures of 2500 K (A), 3000 K (B), 4000 K (C), 6500 K (D), and 10000 K (E). The spectral components at a color temperature of 6500 K are numbered in accordance with the corresponding spectral distributions depicted in section A of FIG. 1.

Figure 8:
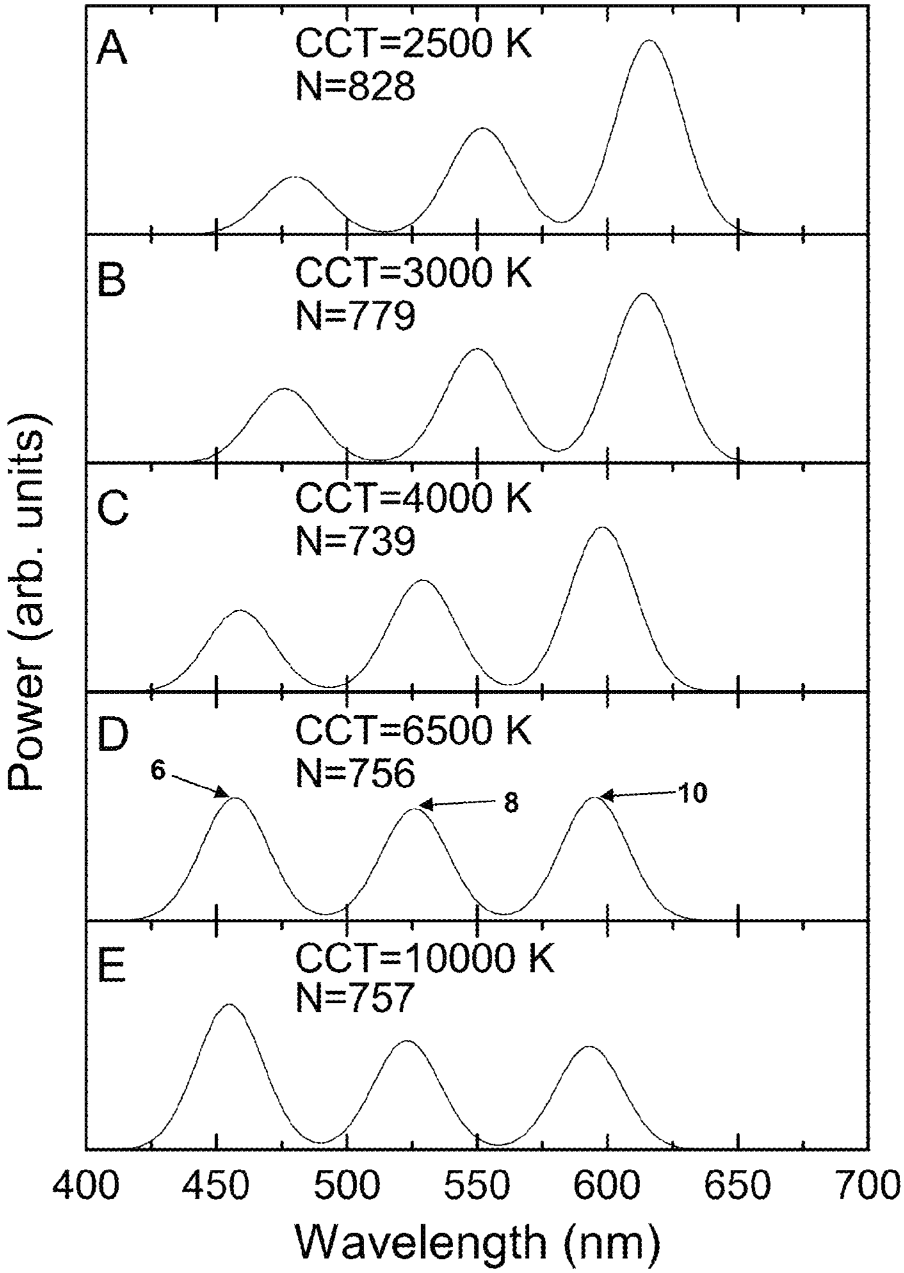

FIG. 8 shows the spectral power distribution for LED-based polychromatic source of white light utilizing 3 sets of colored LEDs, for the highest possible number of rendered test color samples (indicated). The spectra are simulated for the correlated color temperatures of 2500 K (A), 3000 K (B), 4000 K (C), 6500 K (D), and 10000 K (E). The spectral components at a color temperature of 6500 K are numbered in accordance with the corresponding spectral distributions depicted in section B of FIG. 1.

Figure 9:
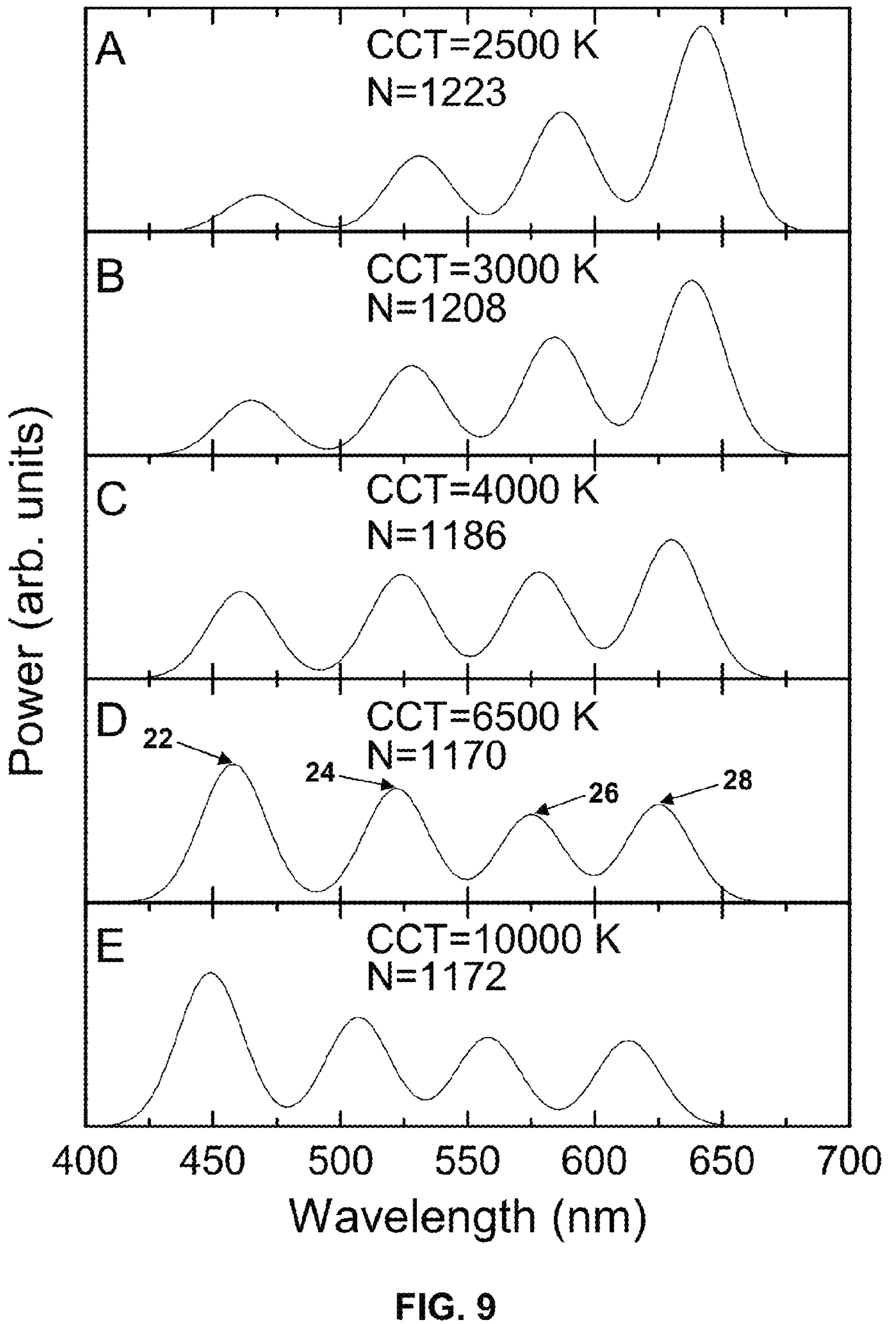

FIG. 9 shows the spectral power distribution for LED-based polychromatic source of white light utilizing 4 sets of colored LEDs, for the highest possible number of rendered test color samples (indicated). The spectra are simulated for the correlated color temperatures of 2500 K (A), 3000 K (B), 4000 K (C), 6500 K (D), and 10000 K (E). The spectral components at a color temperature of 6500 K are numbered in accordance with the corresponding spectral distributions depicted in section C of FIG. 1.

Figure 10:
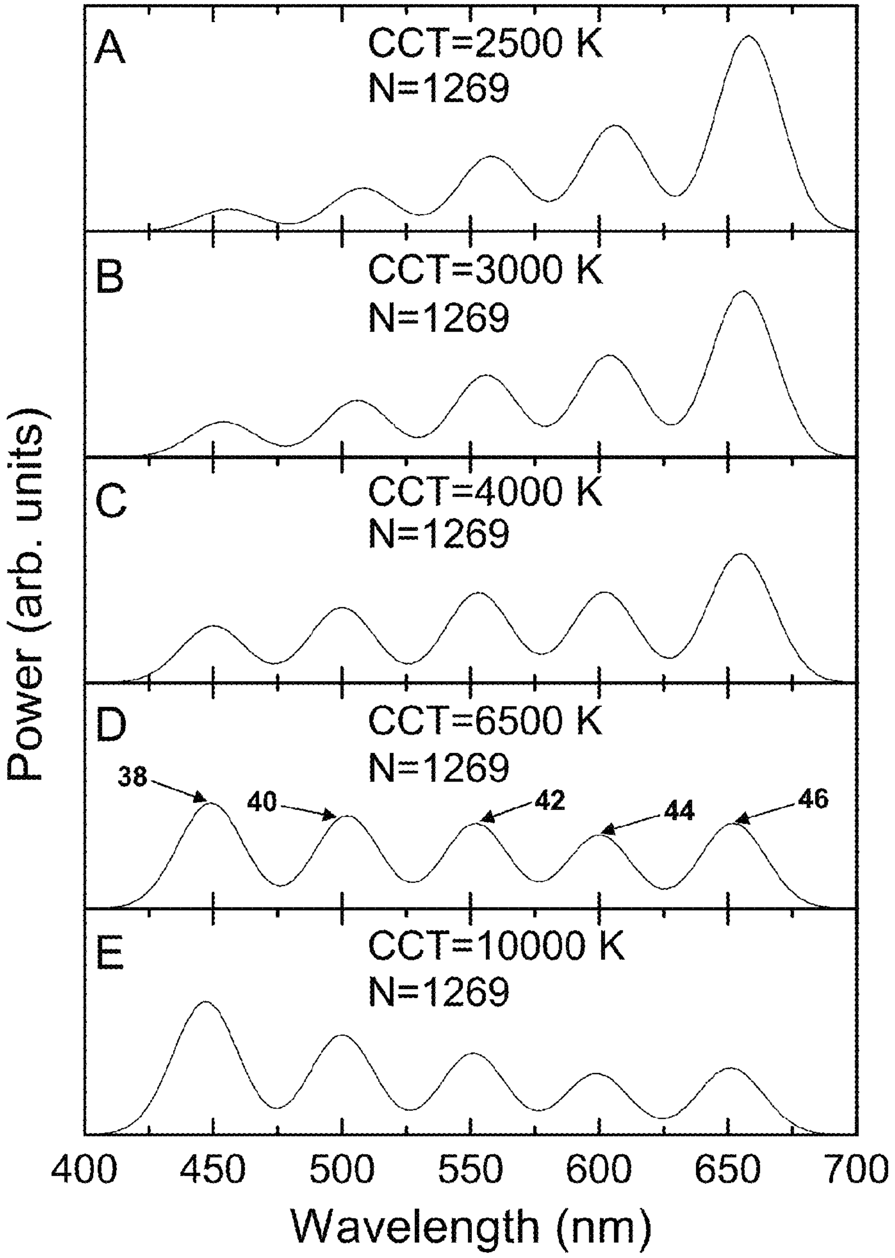

FIG. 10 shows the spectral power distribution for LED-based polychromatic source of white light utilizing 5 sets of colored LEDs, for the highest possible number of rendered test color samples (indicated). The spectra are simulated for the correlated color temperatures of 2500 K (A), 3000 K (B), 4000 K (C), 6500 K (D), and 10000 K (E). The spectral components at a color temperature of 6500 K are numbered in accordance with the corresponding spectral distributions depicted in section D of FIG. 1.

From data such as that depicted in FIGS. 1-10, and other data similarly obtained in accordance with the teachings of aspects of the present invention, optimized multi-chromatic sources of white light can be provided such that the white light renders the highest number of colors $N_r$ relevant to human vision almost indistinguishably from a blackbody radiator or daylight-phase illuminant. For example, the white light source may comprise:

A) two sets of colored light-emitting diodes, with the peak wavelengths falling into the intervals of around 455-505 nm and 560-610 nm, when the chromaticity and lightness shifts are preserved for more than 35 different test color samples. More generally, the chromaticity and lightness shifts are preserved for more than about 2.5 percent of the number of different test color samples;

B) three sets of colored light-emitting diodes, with the peak wavelengths falling into the intervals of around 445-490 nm, 515-560 nm, and 580-625 nm, when the chromaticity and lightness shifts are preserved for more than 250 different test color samples. More generally, the chromaticity and lightness shifts are preserved for more than about 20 percent of the number of different test color samples;

C) four sets of colored light-emitting diodes, with the peak wavelengths falling into the intervals of around 440-480 nm, 500-540 nm, 550-600 nm, and 600-650 nm, when the chromaticity and lightness shifts are preserved for more than 400 different test color samples. More generally, the chromaticity and lightness shifts are preserved for more than about 30 percent of the number of different test color samples; and D) five sets of colored light-emitting diodes, with the peak wavelengths falling into the intervals of around 440-465 nm, 490-515 nm, 540-565 nm, 590-615 nm, and 640-665 nm, when the chromaticity and lightness shifts are preserved for more than 450 different test color samples. More generally, the chromaticity and lightness shifts are preserved for more than about 35 percent of the number of different test color samples.

In each of these cases, a correlated color temperature in the range of around 2500 to 10000 K can be set by adjusting the relative fluxes generated by each group of colored light-emitting diodes.

The white light source may also comprise, for example:

A) three sets of colored light-emitting diodes with the peak wavelengths of the primary LEDs around 457 nm, 526 nm, and 595 nm and with the correlated color temperature of around 6500 K close to that of daylight set by adjusting the relative fluxes generated by each set of colored light-emitting diodes to about 0.34, 0.31, and 0.35, respectively, whereas the chromaticity and lightness shifts are preserved for more than 500 different test color samples. More generally, the chromaticity and lightness shifts are preserved for more than about 40 percent of the number of different test color samples;

B) four sets of colored light-emitting diodes with the peak wavelengths of the primary LEDs around 458 nm, 522 nm, 575 nm, and 625 nm and with the correlated color temperature of around 6500 K close to that of daylight set by adjusting the relative fluxes generated by each set of colored light-emitting diodes to about 0.32, 0.26, 0.20, and 0.22, respectively, whereas the chromaticity and lightness shifts are preserved for more than 800 different test color samples. More generally, the chromaticity and lightness shifts are preserved for more than about 60 percent of the number of different test color samples; and C) five sets of colored light-emitting diodes with the peak wavelengths of the primary LEDs and around 449 nm, 502 nm, 552 nm, 600 nm, and 652 nm and with the correlated color temperature of around 6500 K close to that of daylight set by adjusting the relative fluxes generated by each set of colored light-emitting diodes to about 0.24, 0.21, 0.19, 0.17, and 0.19, respectively, whereas the chromaticity and lightness shifts are preserved for more than 900 different test color samples. More generally, the chromaticity and lightness shifts are preserved for more than about 70 percent of the number of different test color samples.

Figure 11:
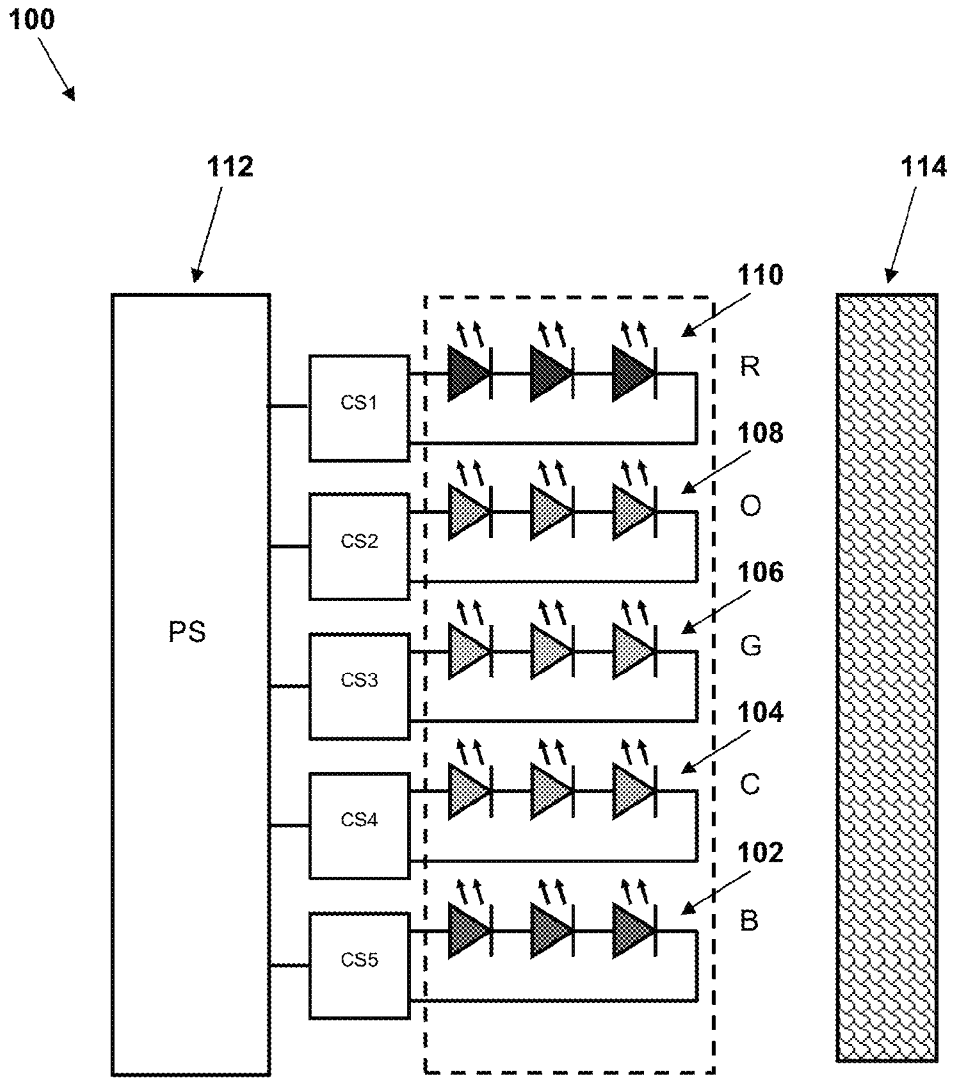
FIG. 11 shows an illustrative design of a polychromatic source of white light using five groups of colored LEDs with each LED containing a single chip that emits a narrow-band light, specified by the peak wavelength.

FIG. 11 depicts an illustrative polychromatic source 100 of white light in accordance with an embodiment of the present invention. The source 100 employs five sets 102 (blue), 104 (cyan), 106 (green), 108 (orange), 110 (red) of colored LEDs, with each LED containing a single chip that emits a narrow-band light, specified by the peak wavelength. Each set 102, 104, 106, 108, 110 is driven by an independent source CS1, CS2, CS3, CS4, CS5, respectively, of dc or pulsed current from a power supply 112 in order to accurately tailor the required partial fluxes. The source 100 is equipped with a color mixer 114 to provide uniform distribution of radiation from the emitters of the different sets of LEDs over the illuminated objects.

Figure 12:
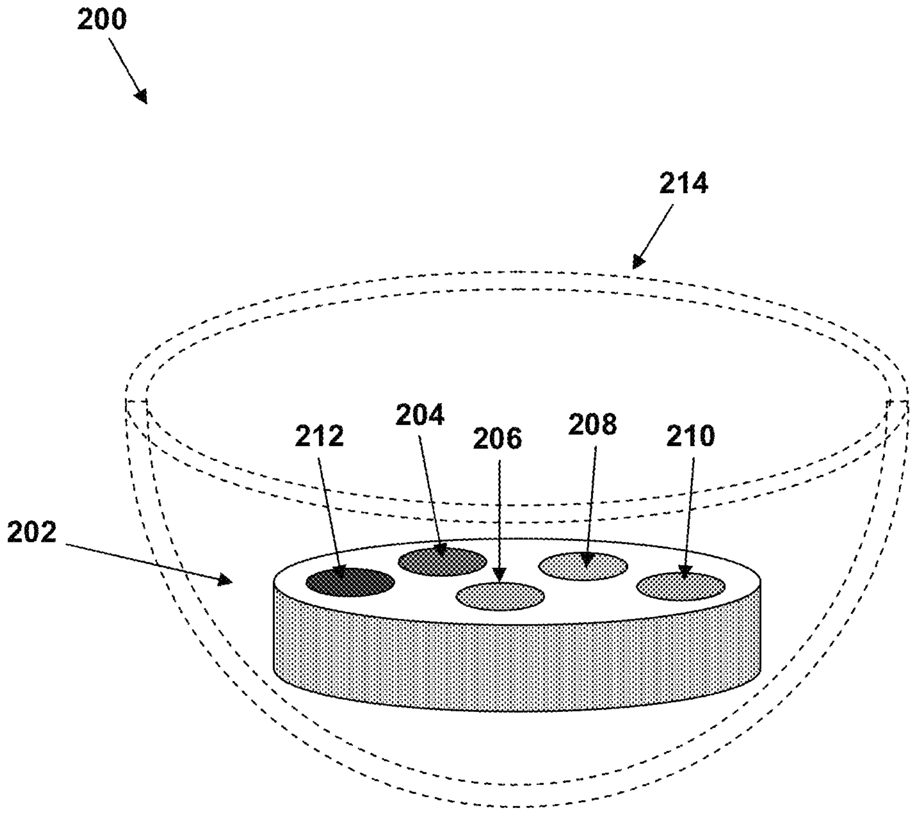
FIG. 12 shows an illustrative design of a polychromatic source if white light using a chip with five different active layers that are formed using selective area deposition of semiconductor layers.

Another illustrative polychromatic source 200 of white light in accordance with an embodiment of the present invention is shown in FIG. 12. The source 200 includes a semiconductor chip 202 with five different active layers 204 (blue), 206 (cyan), 208 (green), 210 (orange), 212 (red) that are formed using selective area deposition of semiconductor layers. The chip 202 is mounted within a metal cup 214 that serves as a non-imaging concentrator and color mixer. The peak wavelengths emitted by the different active layers are adjusted by tailoring chemical composition of the active layers and/or the thickness of the active layers.

Further objects and advantages are to provide a design for the high quality solid state white light source that can be used to replace sunlight in any color-sensitive applications, such as filming, photographing, and designing, in medicine for the seasonal disease treatment and prophylactics, in psychology for depression treatment and prophylactics, etc. The same method based on the evaluation of the number of rendered colors $N_r$, from a given set of samples can be used for color compensation calibrations in digital cameras, color printing, and other applications.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims. For example, similar white light sources can be provided using lasers, with a somewhat lower number of rendered colors.

What is claimed is:

1. A method of fabricating a light source, the method comprising:

obtaining at least two sets of visible-light emitters, each set of emitters having a primary color; and configuring the at least two sets of visible-light emitters using a plurality of test color samples including more than fourteen test color samples resolved by an average human eye as different and a reference light source dissimilar from the at least two sets of visible-light emitters, by performing a method comprising:

selecting at least one of: the primary colors or relative fluxes generated by each set of emitters to maximize a number of the plurality of test color samples for which, when illuminated using the light source having a predetermined correlated color temperature instead of the reference light source having the same correlated color temperature:

chromaticity shifts resulting from use of the light source instead of the reference light source are preserved within corresponding regions of a chromaticity diagram, each region defined by a color at a center of the region and a predetermined chromaticity variation value from the color at the center of the region; and lightness shifts resulting from use of the light source instead of the reference light source are preserved within a predetermined lightness variation value.

2. The method of claim 1, wherein the predetermined chromaticity variation value is a 3-step MacAdam ellipse and the lightness variation value is approximately 2%.

3. The method of claim 1, wherein the plurality of light samples is a spectrophotometrically calibrated set of 1269 Munsell samples.

4. The method of claim 1, wherein the reference light source is one of: a blackbody radiator or an extrapolated daylight illuminant.

5. The method of claim 4, wherein the at least two sets of visible-light emitters comprises two to five sets of light-emitting diodes selected from the group consisting of:

two sets of colored light-emitting diodes, with peak wavelengths of around 455-505 nm and 560-610 nm, wherein the chromaticity and lightness shifts are preserved for more than about 2.5 percent of the plurality of different test color samples;

three sets of colored light-emitting diodes, with peak wavelengths of around 445-490 nm, 515-560 nm, and 580-625 nm, wherein the chromaticity and lightness shifts are preserved for more than about 20 percent of the plurality of different test color samples;

four sets of colored light-emitting diodes, with peak wavelengths of around 440-480 nm, 500-540 nm, 550-600 nm, and 600-650 nm, wherein the chromaticity and lightness shifts are preserved for more than about 30 percent of the plurality of different test color samples; and five sets of colored light-emitting diodes, with peak wavelengths of around 440-465 nm, 490-515 nm, 540-565 nm, 590-615 nm, and 640-665 nm, wherein the chromaticity and lightness shifts are preserved for more than about 35 percent of the plurality of different test color samples;

with the predetermined correlated color temperature in the range of around 2500 to 10000 K set by adjusting the relative fluxes generated by each set of colored light-emitting diodes.

6. The method of claim 4, wherein the at least two sets of visible-light emitters comprises three to five sets of light-emitting diodes selected from the group consisting of:

three sets of colored light-emitting diodes with the peak wavelengths of the light emitting diodes around 457 nm, 526 nm, and 595 nm, and with the correlated color temperature of around 6500 K set by adjusting the relative fluxes generated by each set of colored light-emitting diodes to about 0.34, 0.31, and 0.35, respectively, wherein the chromaticity and lightness shifts are preserved for more than about 40 percent of the plurality of different test color samples;

four sets of colored light-emitting diodes with the peak wavelengths of the light-emitting diodes around 458 nm, 522 nm, 575 nm, and 625 nm, and with the correlated color temperature of around 6500 K set by adjusting the relative fluxes generated by each set of colored light-emitting diodes to about 0.32, 0.26, 0.20, and 0.22, respectively, wherein the chromaticity and lightness shifts are preserved for more than about 60 percent of the plurality of different test color samples; and five sets of colored light-emitting diodes with the peak wavelengths of the light-emitting diodes around 449 nm, 502 nm, 552 nm, 600 nm, and 652 nm, and with the correlated color temperature of around 6500 K set by adjusting the relative fluxes generated by each set of colored light-emitting diodes to about 0.24, 0.21, 0.19, 0.17, and 0.19, respectively, wherein the chromaticity and lightness shifts are preserved for more than about 70 percent of the plurality of different test color samples.

7. The method of claim 1, further comprising installing the at least two sets of emitters in at least one package of the light source, each set of emitters having a different peak wavelength.

8. The method of claim 6, wherein the at least one package is integrated in a semiconductor chip, and wherein the peak wavelength of each set of emitters is adjusted by tailoring at least one of a chemical composition of an active layer or a thickness of the active layer forming each emitter.

9. The method of claim 1, further comprising installing a component for uniformly distributing radiation from the at least two sets of light emitters over an illuminated object on the light source.

10. A lighting method, comprising:

configuring at least two sets of visible-light emitters using a plurality of test color samples including more than fourteen test color samples resolved by an average human eye and a reference light source dissimilar from the at least two sets of visible-light emitters, each set of emitters having a primary color, wherein the configuring includes selecting at least one of: the primary colors or relative fluxes generated by each set of emitters to maximize a number of the plurality of test color samples for which, when illuminated using the light source having a predetermined correlated color temperature instead of the reference light source having the same correlated color temperature:

chromaticity shifts resulting from use of the light source instead of the reference light source are preserved within corresponding regions of a chromaticity diagram, each region defined by a color at a center of the region and a predetermined chromaticity variation value from the color at the center of the region; and lightness shifts resulting from use of the light source instead of the reference light source are preserved within a predetermined lightness variation value.

11. The lighting method of claim 10, wherein the predetermined chromaticity variation value is a 3-step MacAdam ellipse and the lightness variation value is approximately 2%.

12. The lighting method of claim 10, wherein the plurality of light samples is a spectrophotometrically calibrated set of 1269 Munsell samples.

13. The lighting method of claim 10, wherein the reference light source is one of: a blackbody radiator or an extrapolated daylight illuminant.

14. The lighting method of claim 13, wherein the at least two sets of visible-light emitters comprises two to five sets of light-emitting diodes selected from the group consisting of:

two sets of colored light-emitting diodes, with peak wavelengths of around 455-505 nm and 560-610 nm, wherein the chromaticity and lightness shifts are preserved for more than about 2.5 percent of the plurality of different test color samples;

three sets of colored light-emitting diodes, with peak wavelengths of around 445-490 nm, 515-560 nm, and 580-625 nm, wherein the chromaticity and lightness shifts are preserved for more than about 20 percent of the plurality of different test color samples;

four sets of colored light-emitting diodes, with peak wavelengths of around 440-480 nm, 500-540 nm, 550-600 nm, and 600-650 nm, wherein the chromaticity and lightness shifts are preserved for more than about 30 percent of the plurality of different test color samples; and five sets of colored light-emitting diodes, with peak wavelengths of around 440-465 nm, 490-515 nm, 540-565 nm, 590-615 nm, and 640-665 nm, wherein the chromaticity and lightness shifts are preserved for more than about 35 percent of the plurality of different test color samples;

with the predetermined correlated color temperature in the range of around 2500 to 10000 K set by adjusting the relative fluxes generated by each set of colored light-emitting diodes.

15. The lighting method of claim 13, wherein the at least two sets of visible-light emitters comprise three to five sets of light-emitting diodes selected from the group consisting of:

three sets of colored light-emitting diodes with the peak wavelengths of the light emitting diodes around 457 nm, 526 nm, and 595 nm, and with the correlated color temperature of around 6500 K set by adjusting the relative fluxes generated by each set of colored light-emitting diodes to about 0.34, 0.31, and 0.35, respectively, wherein the chromaticity and lightness shifts are preserved for more than about 40 percent of the plurality of different test color samples;

four sets of colored light-emitting diodes with the peak wavelengths of the light-emitting diodes around 458 nm, 522 nm, 575 nm, and 625 nm, and with the correlated color temperature of around 6500 K set by adjusting the relative fluxes generated by each set of colored light-emitting diodes to about 0.32, 0.26, 0.20, and 0.22, respectively, wherein the chromaticity and lightness shifts are preserved for more than about 60 percent of the plurality of different test color samples; and five sets of colored light-emitting diodes with the peak wavelengths of the light-emitting diodes around 449 nm, 502 nm, 552 nm, 600 nm, and 652 nm, and with the correlated color temperature of around 6500 K set by adjusting the relative fluxes generated by each set of colored light-emitting diodes to about 0.24, 0.21, 0.19, 0.17, and 0.19, respectively, wherein the chromaticity and lightness shifts are preserved for more than about 70 percent of the plurality of different test color samples.

16. A lighting method, comprising:

generating white light using at least two sets of visible-light emitters, each set of emitters having a primary color, wherein the at least two sets of visible-light emitters are configured using a plurality of test color samples including more than fourteen test color samples resolved by an average human eye and a reference light source dissimilar from the at least two sets of visible-light emitters, wherein the at least two sets of visible-light emitters are configured by:

selecting at least one of: the primary colors or relative fluxes generated by each set of emitters to maximize a number of the plurality of test color samples for which, when illuminated using the light source having a predetermined correlated color temperature instead of the reference light source having the same correlated color temperature:

chromaticity shifts resulting from use of the light source instead of the reference light source are preserved within corresponding regions of a chromaticity diagram, each region defined by a color at a center of the region and a predetermined chromaticity variation value from the color at the center of the region; and lightness shifts resulting from use of the light source instead of the reference light source are preserved within a predetermined lightness variation value.

17. The lighting method of claim 16, wherein the predetermined chromaticity variation value is a 3-step MacAdam ellipse and the lightness variation value is approximately 2%.

18. The lighting method of claim 16, wherein the plurality of light samples is a spectrophotometrically calibrated set of 1269 Munsell samples.

19. The lighting method of claim 16, wherein the reference light source is one of: a blackbody radiator or an extrapolated daylight illuminant.

20. The lighting method of claim 16, wherein the at least two sets of visible-light emitters comprise two to five sets of light-emitting diodes.

* * * * *

UNITED STATES PATENT AND TRADEMARK OFFICE

CERTIFICATE OF CORRECTION

PATENT NO. : 8,771,029 B2
APPLICATION NO. : 13/887982
DATED : July 8, 2014
INVENTOR(S) : Zukauskas et al.

It is certified that error appears in the above-identified patent and that said Letters Patent is hereby corrected as shown below:

On the title page, in the inventors, item 72, delete “Ivanaukas” and insert --Ivanauskas--.

Signed and Sealed this
Ninth Day of September, 2014

Michelle K. Lee
*Deputy Director of the United States Patent and Trademark Office*